(12) United States Patent
Hanaoka (10) Patent No.: US 11,881,844 B2
(45) Date of Patent: Jan. 23, 2024

(54) MULTIPLEXER (71) Applicant: Murata Manufacturing Co., Ltd., Kyoto (JP)

(72) Inventor: Kunitoshi Hanaoka, Kyoto (JP)

(73) Assignee: MURATA MANUFACTURING CO., LTD., Kyoto (JP)

(*) Notice: Subject to any disclaimer, the term of this patent is extended or adjusted under 35 U.S.C. 154(b) by 714 days.

(21) Appl. No.: 17/021,126

(22) Filed: Sep. 15, 2020

(65) Prior Publication Data
US 2020/0412336 A1 Dec. 31, 2020

Related U.S. Application Data (63) Continuation of application No. PCT/JP2019/020814, filed on May 27, 2019.

(30) Foreign Application Priority Data

Jun. 6, 2018 (JP) .................. 2018-108923

(51) Int. Cl.
H03H 9/70 (2006.01)
H03H 9/54 (2006.01)
H03H 9/60 (2006.01)
H04J 1/02 (2006.01)

(52) U.S. Cl.
CPC ............. *H03H 9/70* (2013.01); *H03H 9/542* (2013.01); *H03H 9/605* (2013.01); *H04J 1/02* (2013.01)

(58) Field of Classification Search
CPC ...................................... H03H 9/70
See application file for complete search history.

(56) References Cited

U.S. PATENT DOCUMENTS

| 8,970,320 B2 | 3/2015 | Iwaki et al. |
| 2012/0208475 A1* | 8/2012 | Uejima .................. H04B 1/006 455/90.3 |
| 2014/0167877 A1 | 6/2014 | Shimizu et al. |
| 2014/0203887 A1 | 7/2014 | Murata et al. |

(Continued)

FOREIGN PATENT DOCUMENTS

| CN | 107040263 A | 8/2017 |
| JP | 2001136019 A | 5/2001 |

(Continued)

OTHER PUBLICATIONS

International Search Report issued in Application No. PCT/JP2019/020814, dated Aug. 6, 2019.

(Continued)

*Primary Examiner* — Abdeltif Ajid
(74) *Attorney, Agent, or Firm* — Pearne & Gordon LLP (57) ABSTRACT A multiplexer includes: a switch capable of connecting a common terminal to at least one of a first selection terminal, a second selection terminal, and a third selection terminal at the same time; a first filter connected to the first selection terminal, the first filter having a first pass band; a second filter connected to the second selection terminal, the second filter having a second pass band that is different from the first pass band; and a coupling circuit connected to the third selection terminal and the first filter, the coupling circuit forming a signal path between the third selection terminal and the first filter by electromagnetic coupling.

18 Claims, 4 Drawing Sheets (56) References Cited

U.S. PATENT DOCUMENTS

| | | | |
|---|---|---|---|
| 2016/0156329 A1 | 6/2016 | Takeuchi et al. | |
| 2016/0197643 A1* | 7/2016 | Uejima | H04B 1/40 455/73 |
| 2017/0141801 A1 | 5/2017 | Watanabe | |
| 2017/0338800 A1 | 11/2017 | Uejima | |
| 2018/0062615 A1 | 3/2018 | Kato et al. | |
| 2018/0076834 A1 | 3/2018 | Wloczysiak et al. | |
| 2018/0123549 A1 | 5/2018 | Takeuchi | |
| 2018/0123620 A1 | 5/2018 | Ueno | |
| 2018/0227006 A1 | 8/2018 | Yasuda | |
| 2019/0097672 A1 | 3/2019 | Nosaka | |

FOREIGN PATENT DOCUMENTS

| | | |
|---|---|---|
| JP | 2012109818 A | 6/2012 |
| JP | 2014140115 A | 7/2014 |
| JP | 2016054515 A | 4/2016 |
| JP | 2017098632 A | 6/2017 |
| WO | 2015019722 A1 | 2/2015 |
| WO | 2016125719 A1 | 8/2016 |
| WO | 2016181701 A1 | 11/2016 |
| WO | 2017006866 A1 | 1/2017 |
| WO | 2017006867 A1 | 1/2017 |
| WO | 2017073509 A1 | 5/2017 |
| WO | 2017204347 A1 | 11/2017 |
| WO | 2018110577 A1 | 6/2018 |

OTHER PUBLICATIONS

Written Opinion issued in Application No. PCT/JP2019/020814, dated Aug. 6, 2019.

* cited by examiner

MULTIPLEXER

This is a continuation of International Application No. PCT/JP2019/020814 filed on May 27, 2019 which claims priority from Japanese Patent Application No. 2018-108923 filed on Jun. 6, 2018. The contents of these applications are incorporated herein by reference in their entireties.

BACKGROUND OF THE DISCLOSURE

1. Field of the Disclosure

The present disclosure relates to multiplexers and more particularly to a multiplexer to be used for carrier aggregation.

2. Description of the Related Art

There is a communication device that handles a plurality of frequency bands (multiband) and a plurality of wireless systems (multimode). In a front-end circuit of such a communication device, a multiplexer that multiplexes and demultiplexes signals of the plurality of frequency bands is used. The multiplexer is constituted of, for example, a plurality of filter circuits having pass bands different from each other.

A technique called carrier aggregation (hereinafter, abbreviated to CA) in which communication is performed using two or more frequency bands simultaneously, which constitute the multiband, is also put into practical use. In the multiplexer to be used for CA, two or more filter circuits are used simultaneously to perform processing on two or more signals of different frequency bands simultaneously.

Japanese Unexamined Patent Application Publication No. 2012-109818 (Patent Document 1) discloses a filter circuit including a filter unit having a pass band and a path connected in parallel to the filter unit. With regard to an unwanted signal at an out-of-band frequency, the path has such an impedance that the unwanted signal passing through the path has the opposite phase and the same amplitude as the unwanted signal passing through the filter unit.

This enables the unwanted signal passing through the path and the unwanted signal passing through the filter unit to cancel each other out, thereby improving attenuation characteristics outside the pass band of the filter circuit as a whole.

BRIEF SUMMARY OF THE DISCLOSURE

However, in the related-art filter circuit, it is necessary to provide, in addition to the filter unit, the signal path that causes the phase to be opposite to that of the unwanted signal passing through the filter unit, and this increases the circuit size. Furthermore, depending on the presence or absence of CA and the combination of frequency bands to be used for CA, the multiplexer to be used for CA changes its frequency characteristics to achieve optimum circuit characteristics. However, the related-art filter circuit does not include a mechanism that enables change in attenuation band.

Accordingly, an object of the present disclosure is to provide a multiplexer that can be used for CA and excels in both downsizing and circuit characteristics.

In order to achieve the foregoing object, a multiplexer according to one aspect of the present disclosure includes: a switch including a common terminal, a first selection terminal, a second selection terminal, and a third selection terminal, the switch being capable of connecting the common terminal to at least one of the first selection terminal, the second selection terminal, and the third selection terminal at a same time; a first filter connected to the first selection terminal, the first filter having a first pass band; a second filter connected to the second selection terminal, the second filter having a second pass band that is different from the first pass band; and a coupling circuit connected to the third selection terminal and the first filter, the coupling circuit being capable of forming a signal path between the third selection terminal and the first filter by electromagnetic coupling.

According to the multiplexers of the present disclosure, depending on the state of the switch, it becomes possible to switch the operation mode, for example, between a single mode that uses only the first filter and a CA mode that uses both the first filter and the second filter. Furthermore, by utilizing the switch for switching the operation mode, it becomes possible to connect the coupling circuit in parallel to the first filter and to separate the coupling circuit from the first filter.

The coupling circuit causes the circuit characteristics of the first filter to change, and this enables to change attenuation characteristics (attenuation band and attenuation amount) of the first filter according to the operation mode. The coupling circuit is different from the signal path that causes the phase to be opposite to that of a signal of an attenuation band passing through the first filter, like the one in the related art filter circuit. The coupling circuit can be, for example, configured by simple electromagnetic coupling between a circuit element (wiring conductor or the like) connected to the third selection terminal and the first filter.

This enables to provide a multiplexer that can be used for CA and excels in both downsizing and circuit characteristics while suppressing the increase in the number of components and in the circuit size.

Other features, elements, characteristics and advantages of the present disclosure will become more apparent from the following detailed description of preferred embodiments of the present disclosure with reference to the attached drawings.

DETAILED DESCRIPTION OF THE DISCLOSURE

Hereinafter, an embodiment of the present disclosure will be described in detail with reference to the drawings. Note that the embodiment, which will be described below, illustrates a comprehensive or specific example. Numeric values, shapes, materials, constituting elements, arrangements, and connection modes of the constituting elements, and the like illustrated in the following embodiment are mere examples, and not intended to limit the present disclosure.

Embodiment

A multiplexer according to an embodiment is described using an exemplary multiplexer to be used for CA that uses a first frequency band and a second frequency band. In the following example, both the first frequency band and the second frequency band are operated under a frequency division duplex (FDD) system.

Figure 1:
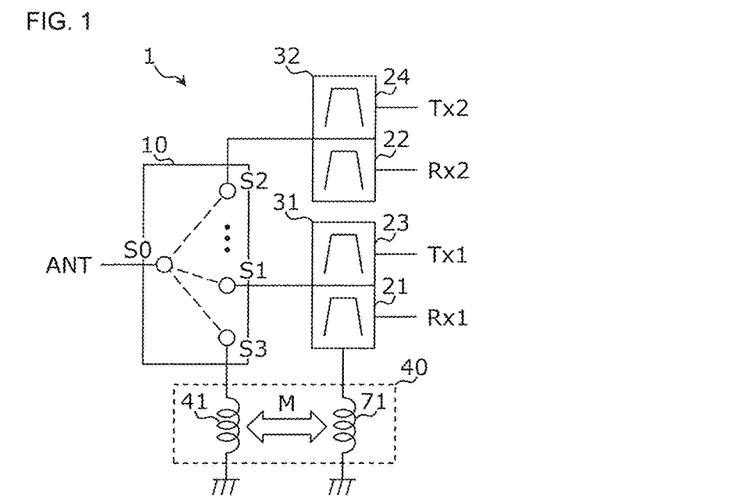
FIG. 1 is a circuit diagram illustrating one example of configuration of a multiplexer according to an embodiment of the present disclosure.

FIG. 1 is a circuit diagram illustrating one example of configuration of a multiplexer according to an embodiment. As illustrated in FIG. 1, a multiplexer 1 includes a switch 10, filters 21, 22, 23, and 24, and inductors 41 and 71. The filters 21 and 23 constitute a duplexer 31, and the filters 22 and 24 constitute a duplexer 32. The inductors 41 and 71 constitute a coupling circuit 40.

The switch 10 includes a common terminal S0 and selection terminals S1, S2, and S3 and is capable of connecting the common terminal S0 to one or more of the selection terminals S1, S2, and S3 at the same time. The switch 10 may further include another selection terminal. The common terminal S0 transmits an antenna signal ANT.

Here, the selection terminals S1, S2, and S3 are examples of a first selection terminal, a second selection terminal, and a third selection terminal, respectively.

The filters 21 and 23 are each a band pass filter, a high pass filter, or a low pass filter whose pass band includes a receive band and a transmit band of the first frequency band. The filter 21 and 23 are connected to each other at their end portions and to the selection terminal S1 of the switch 10. The other end portion of the filter 21 transmits a receive signal Rx1 of the first frequency band, and the other end portion of the filter 23 transmits a transmit signal Tx1 of the first frequency band. According to this, the duplexer 31 demultiplexes and multiplexes the receive signal Rx1 and the transmit signal Tx1 of the first frequency band out of the antenna signal ANT being transmitted to the selection terminal S1.

Here, the filter 21 is one example of a first filter, and the receive band of the first frequency band is one example of a first pass band. The filter 23 is one example of a third filter, and the transmit band of the first frequency band is one example of a third pass band. The duplexer 31 is one example of a first duplexer.

The filters 22 and 24 are each a band pass filter, a high pass filter, or a low pass filter whose pass band includes a receive band and a transmit band of the second frequency band. The filter 22 and 24 are connected to each other at their end portions and to the selection terminal S2 of the switch 10. The other end portion of the filter 22 transmits a receive signal Rx2 of the second frequency band, and the other end portion of the filter 24 transmits a transmit signal Tx2 of the second frequency band. According to this, of the antenna signal ANT being transmitted to the selection terminal S2, the duplexer 32 demultiplexes and multiplexes the receive signal Rx2 and the transmit signal Tx2 of the second frequency band.

Here, the filter 22 is one example of a second filter, and the receive band of the second frequency band is one example of a second pass band. The filter 24 is one example of a fourth filter, and the transmit band of the second frequency band is one example of a fourth pass band. The duplexer 32 is one example of a second duplexer.

The inductor 41 is connected to the selection terminal S3 of the switch 10 at one end portion and to ground at the other end portion. The inductor 71 is connected to the filter 21 at one end portion and to the ground at the other end portion. The inductor 71 may be included in the filter 21. The inductors 41 and 71 may each be any circuit element having an inductive component and are not limited to any specific configuration. For example, the inductors 41 and 71 may each be a chip inductor or an inductive component that a wiring conductor has.

The inductors 41 and 71 are arranged in such a manner as to be magnetically coupled to each other. This enables the coupling circuit 40 to form a signal path between the selection terminal S3 of the switch 10 and the filter 21 by magnetic coupling M between the inductors 41 and 71.

Here, the coupling circuit 40 may alternatively be configured by using circuit elements having capacitive components instead of the inductors 41 and 71. In this case, the coupling circuit 40 forms a signal path between the selection terminal S3 of the switch 10 and the filter 21 by electrical coupling between circuit elements each having a capacitive component.

According to the multiplexer 1 configured as described above, depending on the state of the switch 10, it becomes possible to switch the operation mode, for example, between a single mode that uses only one of the duplexers 31 and 32 and a CA mode that uses both the duplexers 31 and 32. Furthermore, by utilizing the switch 10 for switching the operation mode, it becomes possible to connect the coupling circuit 40 in parallel to the filter 21 of the duplexer 31 and to separate the coupling circuit 40 from the filter 21.

The coupling circuit 40 causes the circuit characteristics of the filter 21 to change by being connected and being separated to and from the filter 21, and this enables to change attenuation characteristics (attenuation band and attenuation amount) of the filter 21 to preferred characteristics suitable for the operation mode. The coupling circuit 40 is different from the path described in the Patent Document 1, which prepares a cancelling signal in such a way that the cancelling signal has the opposite phase and the same amplitude as a signal in an attenuation band passing through the filter 21, and is configured simply by magnetic coupling between the inductor 41 connected to the selection terminal S3 and the inductor 71 connected to the filter 21.

The coupling circuit 40 is described in detail using a specific example in the case where the filter 21 is a ladder filter.

Figure 2:
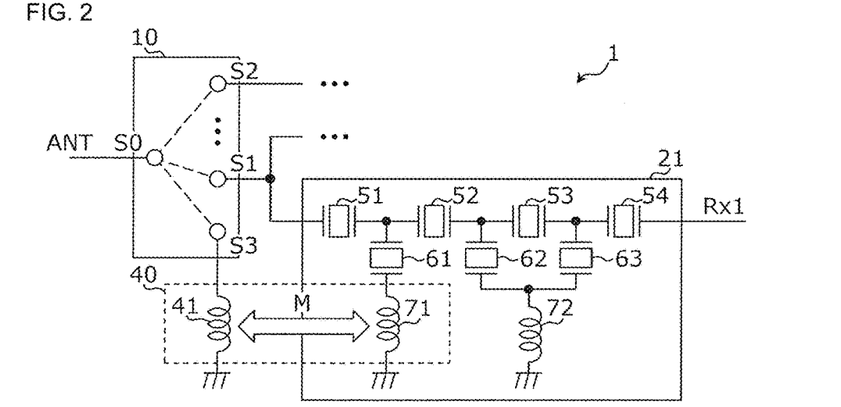
FIG. 2 is a circuit diagram illustrating one specific example of configuration of a coupling circuit according to an embodiment of the present disclosure.

FIG. 2 is a circuit diagram illustrating one specific example of the coupling circuit 40. As illustrated in FIG. 2, the filter 21 includes series arm resonators 51 to 54 arranged along a signal path and parallel arm resonators 61 to 63 arranged along ground paths connecting the signal path and ground. The series arm resonators 51 to 54 and the parallel arm resonators 61 to 63 are constituted of acoustic wave resonators (surface acoustic wave resonator, bulk acoustic wave resonator, or the like). That is to say, the filter 21 in FIG. 2 is a ladder-type acoustic wave filter.

The filter 21 includes inductors 71 and 72 for adjusting characteristics. The inductor 71 is connected to the parallel arm resonator 61 at one end portion and is connected to the ground at the other end portion. The inductor 72 is connected to a connection point between the parallel arm resonators 62 and 63 at one end portion and is connected to the ground at the other end portion.

The coupling circuit 40 of FIG. 2 is formed by coupling between the inductor 41 connected to the selection terminal S3 of the switch 10 and the inductor 71 for adjusting characteristics, which is included in the filter 21.

Note that the coupling circuit 40 is not limited to the example of FIG. 2 and may alternatively be formed by coupling between the inductors 41 and 72. In the case where the filter 21 includes an inductor provided in the signal path, the coupling circuit 40 may be formed by coupling between the inductor 41 and the inductor in the signal path of the filter 21.

In the multiplexer 1 of FIG. 2, the attenuation characteristics of the filter 21 are changed by utilizing a change in the frequency of an attenuation pole of the filter 21, which is caused by connecting and separating of the coupling circuit 40. As described above, by utilizing the inductor included in the filter 21, the coupling circuit 40 is configured without increasing the number of components.

A mounting structure of the multiplexer 1 is described using an example in which an integrated circuit (IC) chip constitutes the switch 10, filter elements constitute the duplexers 31 and 32, and chip inductors constitute the inductors 41, 71, and 72.

Figure 3:
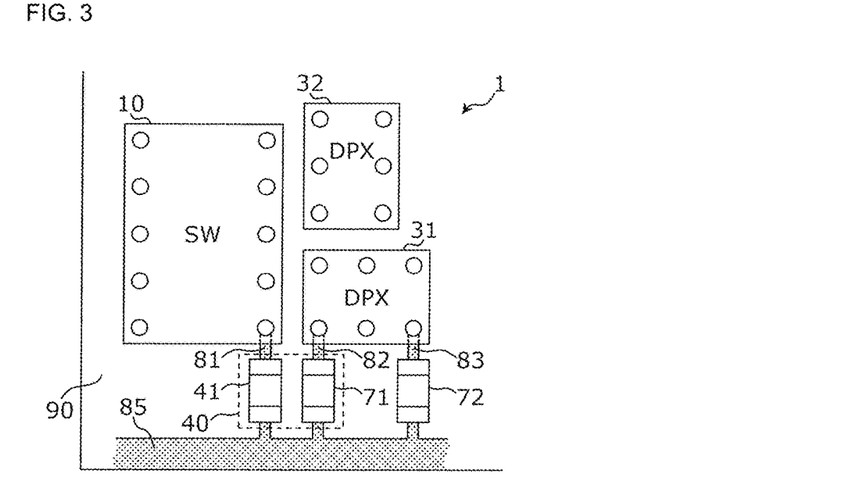
FIG. 3 is a schematic diagram illustrating one example of a mounting structure of a multiplexer according to an embodiment of the present disclosure.

FIG. 3 is a schematic diagram illustrating one example of the mounting structure of the multiplexer 1 of FIG. 2. In the example of FIG. 3, the IC chip serving as the switch 10, the filter elements serving as the duplexers 31 and 32, and the chip inductors serving as the inductors 41, 71, and 72 are mounted on a substrate 90. Wiring conductors 81, 82, and 83 and a ground electrode 85 are formed on the substrate 90, the inductor 41 is connected to the switch 10 via the wiring conductor 81 and to the ground electrode 85, and the inductors 71 and 72 are connected to the duplexer 31 via the wiring conductors 82 and 83 respectively and to the ground electrode 85.

The inductors 41 and 71 constitute the coupling circuit 40 by being arranged at positions that allows the inductors 41 and 71 to be magnetically coupled to each other. The inductors 41 and 71 are constituted of the chip inductors, and this enables to adjust the coupling according to the arrangement of the inductors 41 and 71, thereby facilitating the adjustment of the coupling circuit 40. Note that the inductors 41, 71, and 72 are not limited to the chip inductors and may alternatively be inductive components of wiring conductors formed on the substrate 90.

The multiplexer 1 may be formed as a single component or may be formed as one of circuit units included in a radio frequency module and formed on a module substrate together with other circuit units.

In the following, characteristics of the multiplexer 1 are described based on a specific usage example of the multiplexer 1.

Figure 4:
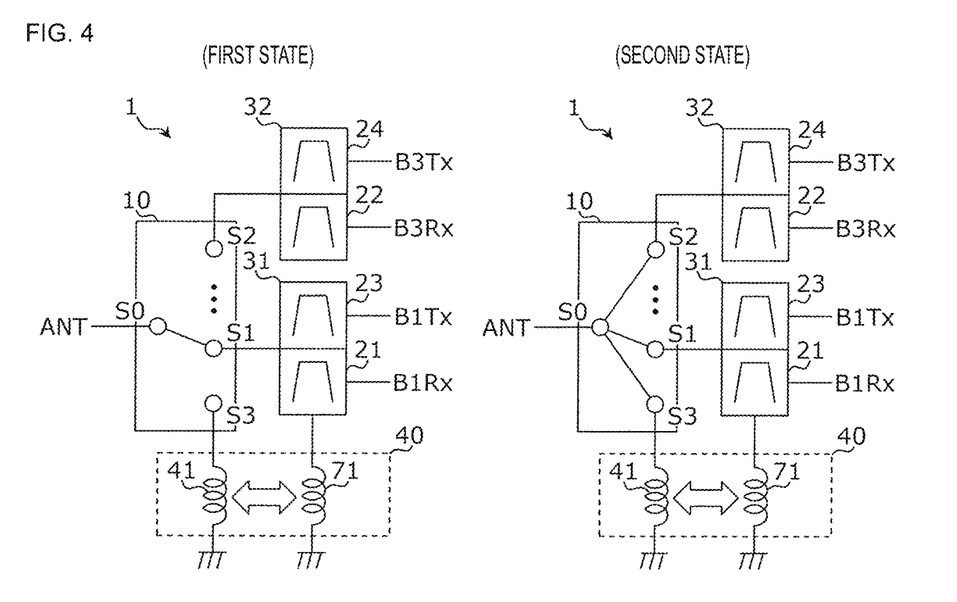
FIG. 4 illustrates circuit diagrams illustrating usage examples of a multiplexer according to an embodiment of the present disclosure.

FIG. 4 is a circuit diagram illustrating usage examples of the multiplexer 1 and illustrates connection states of the switch 10 in two different operation modes as well as specific frequency bands to be used for the respective filters 21 to 24. In the following, specific frequency bands are referred by the names of communication bands in Long Term Evolution (LTE (registered trademark)) defined by Third Generation Partnership Project (3GPP).

In the example of FIG. 4, the filter 21 includes a receive band (2110 MHz-2170 MHz) of Band B1 in its pass band, and the filter 23 includes a transmit band (1920 MHz-1980 MHz) of Band B1 in its pass band. According to this, of an antenna signal ANT being transmitted to the selection terminal S1, the duplexer 31 demultiplexes and multiplexes a receive signal B1Rx and a transmit signal B1Tx of Band B1.

Furthermore, the filter 22 includes a receive band (1805 MHz-1880 MHz) of Band B3 in its pass band, and the filter 24 includes a transmit band (1710 MHz-1785 MHz) of Band B3 in its pass band. According to this, of an antenna signal ANT being transmitted to the selection terminal S2, the duplexer 32 demultiplexes and multiplexes a receive signal B3Rx and a transmit signal B3Tx of Band B3.

The multiplexer 1 switches between a single mode that uses only one of Bands B1 and B3 and a CA mode that uses both Bands B1 and B3 in accordance with the connection state of the switch 10.

A first state of FIG. 4 illustrates the connection state of the switch 10 for the single mode that uses only Band B1. In the first state, the common terminal S0 is connected to the selection terminal S1, the common terminal S0 is disconnected from the selection terminal S2, and the common terminal S0 is disconnected from the selection terminal S3.

A second state of FIG. 4 illustrates the connection state of the switch 10 for the CA mode that uses both Bands B1 and B3. In the second state, the common terminal S0 is connected to the selection terminal S1, the common terminal S0 is connected from the selection terminal S2, and the common terminal S0 is connected from the selection terminal S3.

Different frequency characteristics are required for the multiplexer 1 in the single mode and the CA mode. For example, in the single mode, isolation is required between the receive band of Band B1 and the transmit band of Band B1, while in the CA mode, isolation is required between the receive band of Band B1 and both the transmit bands of Bands B1 and B3.

In response to such requirements, it is conceivable to design bandpass characteristics of the filter 21 in such a manner as to attenuate both the transmit bands of Bands B1 and B3. However, compared with the bandpass characteristic that attenuates only the transmit band of Band B1, in the passband characteristic that attenuates both the transmit bands of Bands B1 and B3, the attenuation in the transmit band of Band B1 becomes smaller.

Therefore, when the bandpass characteristics of the filter 21 suited for the CA mode is used in the single mode, the isolation between the transmit band and the receive band of Band B1 becomes worse. This trend is particularly noticeable in the case where the filter 21 is constituted of a ladder-type resonator filter.

Thus, in the multiplexer 1, the frequency characteristics of the filter 21 are changed according to the operation mode by switching the operation mode using the switch 10 and by connecting and disconnecting the coupling circuit 40 to and from the filter 21. Specifically, in the single mode that uses only Band B1, the switch 10 is set to the first state illustrated in FIG. 4, and in the CA mode that uses both Bands B1 and B3, the switch 10 is set to the second state illustrated in FIG. 4. According to this, the attenuation characteristics of the filter 21 are changed between the first state and the second state, and this causes the frequency characteristics of the multiplexer 1 to change as follows.

Figure 5A:
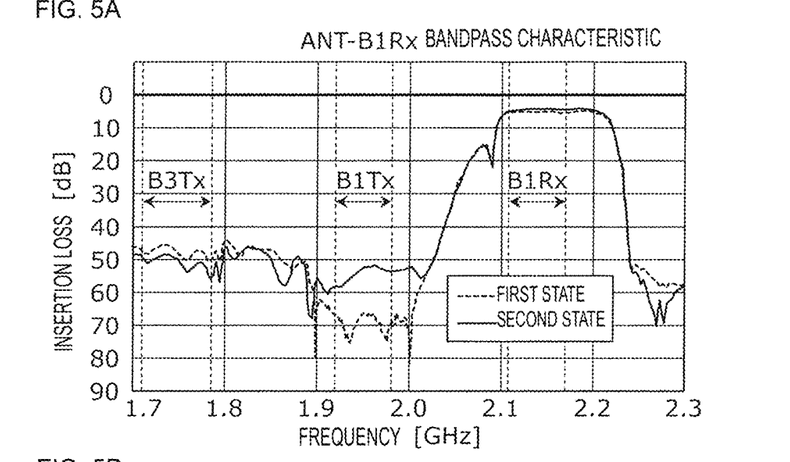
FIG. 5A is a graph illustrating one example of bandpass characteristic of a multiplexer according to an embodiment of the present disclosure.

FIG. 5A is a graph illustrating one example of the bandpass characteristic between the common terminal S0 of the switch 10 and the output port of the filter 21 (ANT-B1Rx). As can be seen in FIG. 5A, in the first state, the attenuation is greater in the transmit band B1Tx of Band B1 compared with the second state, and in the second state, the attenuation is greater in the transmit band B3Tx of Band B3 compared with the first state. The loss in the receive band B1Rx of Band B1 is approximately the same in the first state and the second state.

Figure 5B:
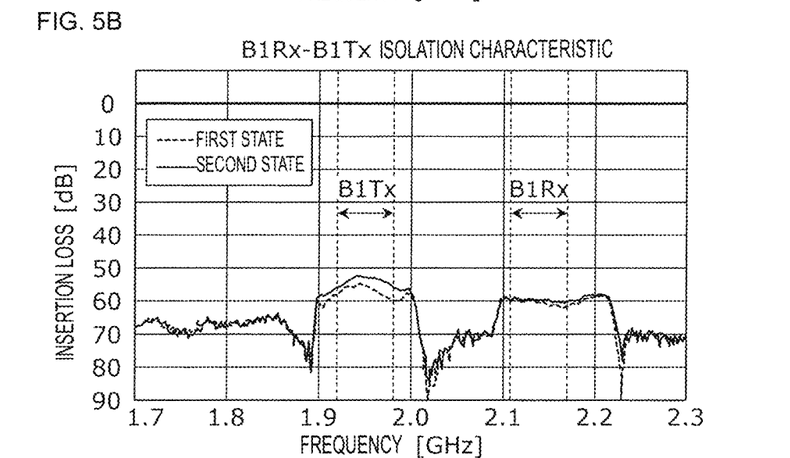
FIG. 5B is a graph illustrating one example of isolation characteristic of a multiplexer according to an embodiment of the present disclosure.

FIG. 5B is a graph illustrating one example of the isolation characteristic between the output port of the filter 21 and the input port of the filter 23 (B1Rx-B1Tx). As can be seen in FIG. 5B, in the first state, the attenuation is greater in the transmit band B1Tx of Band B1 compared with the second state. That is to say, in the single mode (first state), a larger isolation is secured between the receive band B1Rx and the transmit band B1Tx of Band B1 compared with the CA mode (second state).

Figure 5C:
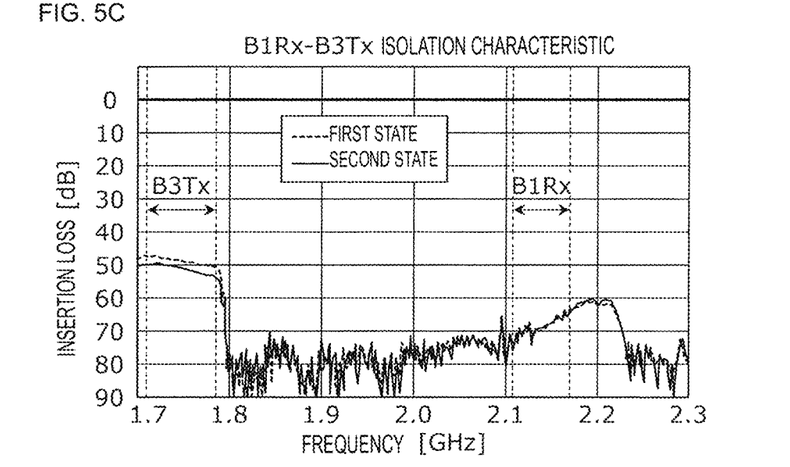
FIG. 5C is a graph illustrating one example of isolation characteristic of a multiplexer according to an embodiment of the present disclosure.

FIG. 5C is a graph illustrating one example of the isolation characteristic between the output port of the filter 21 and the input port of the filter 24 (B1Rx-B3Tx). As can be seen in FIG. 5C, in the second state, the attenuation is greater in the transmit band B3Tx of Band B3 compared with the first state. That is to say, in the CA mode (second state), a larger isolation is secured between the receive band B1Rx of Band B1 and the transmit band B3Tx of Band B3 compared with the single mode (first state).

From the frequency characteristics illustrated in FIG. 5A, FIG. 5B, and FIG. 5C, it is clear that in the single mode, the usage example of FIG. 4 enables to provide an excellent isolation between the receive band B1Rx and the transmit band B1Tx of Band B1 compared with the CA mode.

As described above, in the multiplexer 1, it becomes possible to have an appropriate frequency characteristic depending on the operation mode by switching the operation mode using the switch 10 and by connecting and disconnecting the coupling circuit 40 to and from the filter 21.

Note that in the usage example of FIG. 4, the coupling circuit 40 is disconnected from the filter 21 in the single mode and connected to the filter 21 in the CA mode. However, this relationship may be reversed. That is to say, the coupling circuit 40 may be connected to the filter 21 in the single mode and disconnected to the filter 21 in the CA mode.

In other words, the coupling circuit 40 may be connected to the filter 21 in the single mode or the CA mode, whichever is more appropriate, depending on whether the attenuation characteristic of the filter 21 is designed on the basis of the single mode or the CA mode.

Note that in the foregoing description, Bands B1 and B3 are used as the examples of specific frequency bands to be used in the multiplexer 1. However, the specific frequency bands to be applied in the multiplexer 1 are not limited thereto. As other examples, the following frequency bands may be used.

That is to say, the filter 21 includes a receive band (1930 MHz-1995 MHz) of Band B25 in its pass band, and the filter 23 includes a transmit band (1850 MHz-1915 MHz) of Band B25 in its pass band. Furthermore, the filter 22 includes a receive band (2110 MHz-2200 MHz) of Band B66 in its pass band, and the filter 24 includes a transmit band (1710 MHz-1780 MHz) of Band B66 in its pass band.

In the case where the filters 21 to 24 have such pass bands, the multiplexer 1 can be used for CA that uses Bands B25 and B66.

Figure 6:
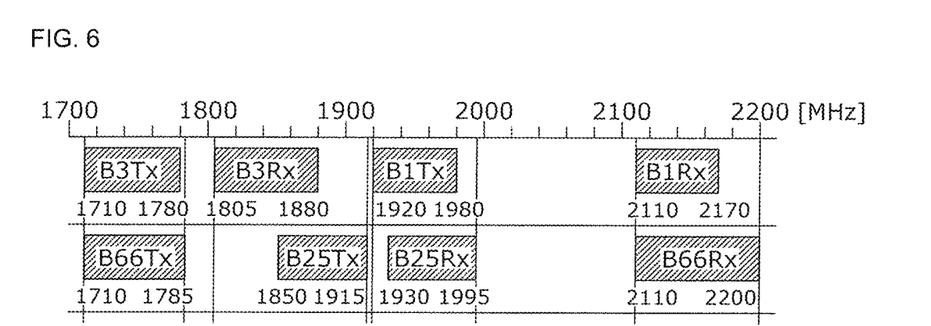
FIG. 6 is a diagram illustrating one example of frequency bands to be used for a multiplexer according to an embodiment of the present disclosure.

FIG. 6 is a diagram illustrating one example of frequency bands to be used for the multiplexer 1. In FIG. 6, the names of communication bands in LTE (registered trademark) referred in the above and the frequency ranges are listed in the order of frequency. As can be seen in FIG. 6, it is clear that there are four sets of overlapping frequency bands such as, for example, the receive band B1Rx of Band B1 and the receive band B66Rx of Band B66, and the like. Thus, in the multiplexer 1, sharing of each of the filters 21 to 24 in the overlapping frequency bands is now considered.

Figure 7:
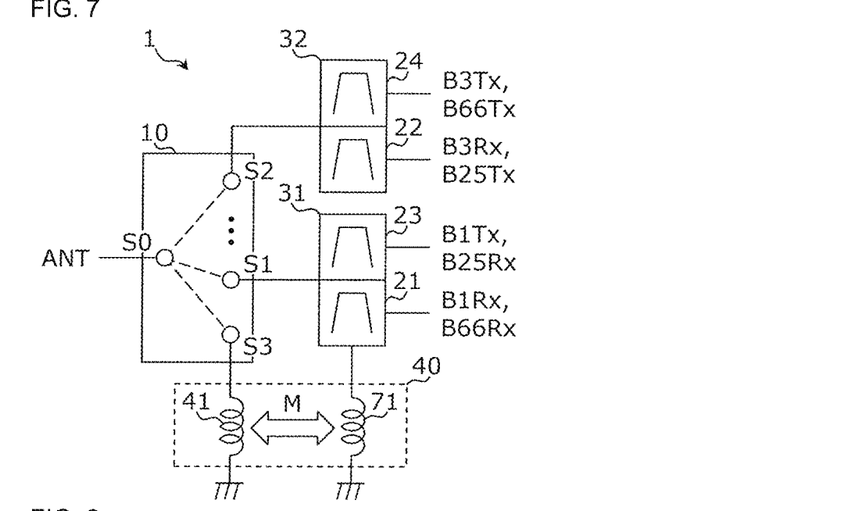
FIG. 7 is a circuit diagram illustrating another usage example of a multiplexer according to an embodiment of the present disclosure.

FIG. 7 is a circuit diagram illustrating a usage example of the multiplexer 1 and illustrates specific frequency bands to be shared in each of the filters 21 to 24.

In the example of FIG. 7, the filter 21 includes both the receive band (2110 MHz-2170 MHz) of Band B1 and the receive band (2110 MHz-2200 MHz) of Band B66 in its pass band. This allows the filter 21 to be shared in the receive band of Band B1 and the receive band of Band B66.

The filter 23 includes both the transmit band (1920 MHz-1980 MHz) of Band B1 and the receive band (1930 MHz-1995 MHz) of Band B25 in its pass band. This allows the filter 23 to be shared in the transmit band of Band B1 and the receive band of Band B25.

The filter 22 includes both the receive band (1805 MHz-1880 MHz) of Band B3 and the transmit band (1850 MHz-1915 MHz) of Band B25 in its pass band. This allows the filter 22 to be shared in the receive band of Band B3 and the transmit band of Band B25.

The filter 24 includes both the transmit band (1710 MHz-1785 MHz) of Band B3 and the transmit band (1710 MHz-1780 MHz) of Band B66 in its pass band. This allows the filter 24 to be shared in the transmit band of Band B3 and the transmit band of Band B66.

According to the multiplexer 1 of FIG. 7, the multiplexer to be used for CA that uses Bands B1 and B3 and CA that uses Bands B25 and B66 is configured by using the four filters.

In the foregoing description, it is assumed that the frequency bands to be applied in the multiplexer 1 are operated under the FDD system. However, the present disclosure is not limited to this example. The frequency bands to be applied in the multiplexer 1 may alternatively be operated under a time division duplex (TDD) system.

Figure 8:
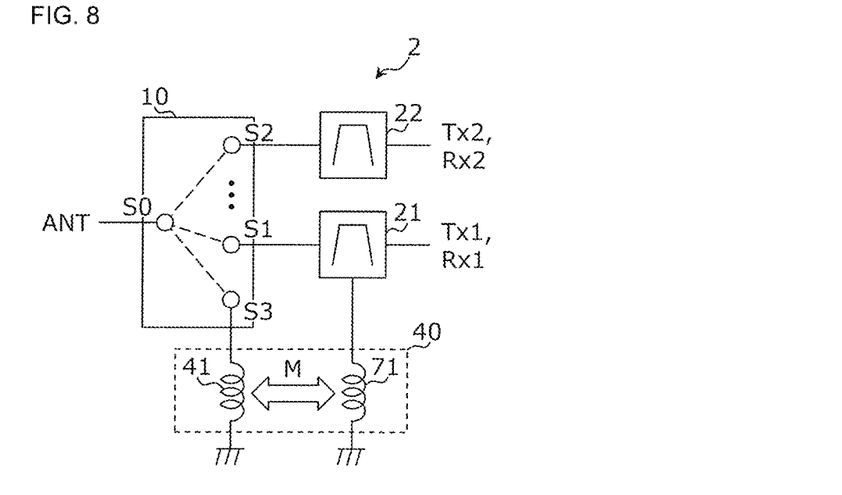
FIG. 8 is a circuit diagram illustrating one example of another configuration of a multiplexer according to an embodiment of the present disclosure.

FIG. 8 is a circuit diagram illustrating one example of configuration of a multiplexer to be used for CA that uses a first frequency band and a second frequency band, each of which is operated under a time division duplex (TDD) system. The multiplexer 2 illustrated in FIG. 8 is different from the multiplexer 1 of FIG. 1 in omitting the filters 23 and 24. In the following, the same reference codes are used to refer the same constituting elements as in the multiplexer 1, and the overlapping descriptions are omitted if appropriate.

In the multiplexer 2, the filter 21 includes the first frequency band (the same for transmission and reception) in its pass band, and the filter 22 includes the second frequency band (the same for transmission and reception) in its pass band. Here, the filter 21 is one example of the first filter, and the first frequency band is one example of the first pass band. The filter 22 is one example of the second filter, and the second frequency band is one example of the second pass band.

As is the case with the multiplexer 1, the multiplexer 2 switches between the single mode that uses only one of the first frequency band and the second frequency band and the CA mode that uses both the first frequency band and the second frequency band in accordance with the connection state of the switch 10.

As is the case with the multiplexer 1, this also enables the multiplexer 2 to have an appropriate frequency characteristic depending on the operation mode.

The multiplexers according to the embodiments of the present disclosure have been described in the above. However, the present disclosure is not limited to any of the embodiments. Embodiments obtained by applying various modifications apparent to those skilled in the art to the embodiments and embodiments formed by combining constituting elements of different embodiments may also be included in the scope of the one or more aspects of the present disclosure as long as they do not depart from the scope of the present disclosure.

CONCLUSION

A multiplexer according to one aspect of the present disclosure includes: a switch including a common terminal, a first selection terminal, a second selection terminal, and a third selection terminal, the switch being capable of connecting the common terminal to at least one of the first selection terminal, the second selection terminal, and the third selection terminal at a same time; a first filter connected to the first selection terminal, the first filter having a first pass band; a second filter connected to the second selection terminal, the second filter having a second pass band that is different from the first pass band; and a coupling circuit connected to the third selection terminal and the first filter, the coupling circuit being capable of forming a signal path between the third selection terminal and the first filter by electromagnetic coupling.

According to such configuration, depending on the state of the switch, it becomes possible to switch the operation mode, for example, between a single mode that uses only the first filter and a CA mode that uses both the first filter and the second filter. Furthermore, by utilizing the switch for switching the operation mode, it becomes possible to connect the coupling circuit in parallel to the first filter and to separate the coupling circuit from the first filter.

The coupling circuit causes the circuit characteristics of the first filter to change by being connected and being separated to and from the first filter, and this enables to change attenuation characteristics (attenuation band and attenuation amount) of the first filter according to the operation mode. The coupling circuit is different from a path that causes the phase to be opposite and the amplitude to be the same as a signal of an attenuation band passing through the first filter. For example, the coupling circuit is configured by simple electromagnetic coupling between circuit elements (wiring conductor or the like) respectively connected to the third selection terminal and the first filter.

This enables to provide a multiplexer that can be used for CA and excels in both downsizing and circuit characteristics while suppressing the increase in the number of components and in the circuit size.

The coupling circuit may include a first circuit element connected to the third selection terminal and a second circuit element connected to the first filter, and the first circuit element and the second circuit element may be electrically coupled or magnetically coupled to one another.

Such configuration enables the attenuation characteristics of the first filter to be adjusted according to the strength of electrical coupling or magnetic coupling between the first circuit element and the second circuit element, and this facilitates the design process to provide preferred attenuation characteristics suitable for the operation mode of the first filter.

The first circuit element and the second circuit element may be a first inductive element and a second inductive element, respectively, and may be magnetically coupled to one another.

According to such configuration, for example, in the case where an inductor for matching or the like is provided in the multiplexer, by utilizing this inductor as the first inductive element or the second inductive element, it becomes possible to have the advantageous effects described above while suppressing the increase in the number of components.

The first filter may be a ladder filter including a series arm resonator placed in a signal path and a parallel arm resonator placed in a ground path connecting a node in the signal path and ground, and the second inductive element may be provided in the signal path or the ground path.

Such configuration enables to change the attenuation characteristics of the first filter by utilizing a change in the frequency of an attenuation pole of the first filter, which is caused by connecting and separating of the coupling circuit.

The second inductive element may be an inductor placed in the ground path and connected between the parallel arm resonator and the ground.

According to such configuration, it becomes possible to have the advantageous effects described above without increasing the number of components by utilizing, as the second inductive element, an inductor for adjusting characteristics, which is often provided in a practical ladder filter between the parallel arm resonator and the ground.

The first inductive element and the second inductive element may each be a chip inductor.

According to such configuration, by forming the first inductive element or the second inductive element using a chip component, it becomes possible to adjust the coupling according to the arrangement of the chip components, and this facilitates the adjustment of the coupling circuit.

The switch may have a first state and a second state; in the first state, the common terminal may be connected to one of the first selection terminal and the second selection terminal, the common terminal may be disconnected from another of the first selection terminal and the second selection terminal, and the common terminal may be disconnected from the third selection terminal; and in the second state, the common terminal may be connected to the first selection terminal, the common terminal may be connected to the second selection terminal, and the common terminal may be connected to the third selection terminal.

Such configuration enables to switch between the single mode that uses only the first filter or only the second filter and the CA mode that uses both the first filter and the second filter in accordance with the specific connection state of the switch.

The multiplexer may further include: a third filter connected to the first selection terminal, the third filter having a third pass band; and a fourth filter connected to the second selection terminal, the fourth filter having a fourth pass band, wherein the first filter and the third filter may constitute a first duplexer, and the second filter and the fourth filter may constitute a second duplexer.

Such configuration enables to provide a multiplexer to be used for CA that uses a plurality of frequency bands operated under an FDD system.

Of the communication bands in LTE (registered trademark), the first pass band may include a receive band of 2110 MHz to 2170 MHz of Band 1, the second pass band may include a receive band of 1805 MHz to 1880 MHz of Band 3, the third pass band may include a transmit band of 1920 MHz to 1980 MHz of Band 1, and the fourth pass band may include a transmit band of 1710 MHz to 1785 MHz of Band 3.

Of the communication bands in LTE (registered trademark), the first pass band may include a receive band of 1930 MHz to 1995 MHz of Band 25, the second pass band may include a receive band of 2110 MHz to 2200 MHz of Band 66, the third pass band may include a transmit band of 1850 MHz to 1915 MHz of Band 25, and the fourth pass band may include a transmit band of 1710 MHz to 1780 MHz of Band 66.

Such configuration enables to provide a multiplexer to be used for CA that uses a plurality of frequency bands in LTE (registered trademark).

A multiplexer according to one aspect of the present disclosure includes: a switch including a common terminal, a first selection terminal, a second selection terminal, and a third selection terminal, the switch being capable of connecting the common terminal to at least one of the first selection terminal, the second selection terminal, and the third selection terminal at a same time; a first filter connected to the first selection terminal, the first filter having a first pass band; a second filter connected to the second selection terminal, the second filter having a second pass band that is different from the first pass band; a first inductor connected between the third selection terminal and ground; and a second inductor connected between the first filter and the ground.

Such configuration enables to form a signal path by coupling the first inductor and the second inductor and to connect and separate this signal path to and from the first filter by switching the switch. This enables to change the attenuation characteristics of the first filter according to the operation mode and to provide a multiplexer that can be used for CA and excels in both downsizing and circuit characteristics while suppressing the increase in the number of components and in the circuit size.

The present disclosure can be, for example, widely utilized as a multiband multimode multiplexer in communication devices such as cellular phones and the like.

While preferred embodiments of the disclosure have been described above, it is to be understood that variations and modifications will be apparent to those skilled in the art without departing from the scope and spirit of the disclosure. The scope of the disclosure, therefore, is to be determined solely by the following claims.

What is claimed is:

1. A multiplexer comprising: a switch including a common terminal, a first selection terminal, a second selection terminal, and a third selection terminal, the switch being configured to selectively connect the common terminal to the first selection terminal, to the second selection terminal, to the third selection terminal, or simultaneously to at least two of the first selection terminal, the second selection terminal, and the third selection terminal; a first filter connected to the first selection terminal, the first filter having a first pass band; a second filter connected to the second selection terminal, the second filter having a second pass band that is different from the first pass band; and a coupling circuit connected to the third selection terminal and the first filter, the coupling circuit being configured to form a signal path between the third selection terminal and the first filter by electromagnetic coupling,
wherein the coupling circuit includes a first circuit element connected to the third selection terminal and a second circuit element connected to the first filter, and the first circuit element and the second circuit element are electrically coupled or magnetically coupled to one another.

2. The multiplexer according to claim 1, wherein the first circuit element and the second circuit element are a first inductive element and a second inductive element, respectively, and are magnetically coupled to one another.

3. The multiplexer according to claim 2, wherein the first filter is a ladder filter including a series arm resonator placed in a signal path and a parallel arm resonator placed in a ground path connecting a node in the signal path and ground, and the second inductive element is provided in the signal path or in the ground path.

4. The multiplexer according to claim 3, wherein the second inductive element is an inductor placed in the ground path and connected between the parallel arm resonator and the ground.

5. The multiplexer according to claim 3, wherein the first inductive element and the second inductive element are each a chip inductor.

6. The multiplexer according to claim 2, wherein the first inductive element and the second inductive element are each a chip inductor.

7. The multiplexer according to claim 2, wherein the switch, the first filter, the second filter, the first inductive element and the second inductive element are mounted on a same substrate.

8. The multiplexer according to claim 7, wherein the first inductive element and the second inductive element are wiring conductors arranged on the same substrate.

9. The multiplexer according to claim 1, wherein the switch has a first state and a second state, in the first state, the common terminal is connected to one of the first selection terminal or the second selection terminal, the common terminal is disconnected from the other one of the first selection terminal or the second selection terminal, and the common terminal is disconnected from the third selection terminal, and in the second state, the common terminal is connected to the first selection terminal, to the second selection terminal, and to the third selection terminal.

10. The multiplexer according to claim 1, wherein the switch has a first state and a second state, in the first state, the common terminal is connected to one of the first selection terminal or the second selection terminal, the common terminal is disconnected from the other one of the first selection terminal or the second selection terminal, and the common terminal is disconnected from the third selection terminal, and in the second state, the common terminal is connected to the first selection terminal, to the second selection terminal, and to the third selection terminal.

11. The multiplexer according to claim 1, further comprising: a third filter connected to the first selection terminal, the third filter having a third pass band; and a fourth filter connected to the second selection terminal, the fourth filter having a fourth pass band, wherein the first filter and the third filter constitute a first duplexer, and the second filter and the fourth filter constitute a second duplexer.

12. The multiplexer according to claim 11, wherein of communication bands of Long Term Evolution (LTE®), the first pass band includes a receive band of 2110 MHz to 2170

MHz of Band 1, the second pass band includes a receive band of 1805 MHz to 1880 MHz of Band 3, the third pass band includes a transmit band of 1920 MHz to 1980 MHz of Band 1, and the fourth pass band includes a transmit band of 1710 MHz to 1785 MHz of Band 3.

13. The multiplexer according to claim 11, wherein of the communication bands of Long Term Evolution (LTE®), the first pass band includes a receive band of 1930 MHz to 1995 MHz of Band 25, the second pass band includes a receive band of 2110 MHz to 2200 MHz of Band 66, the third pass band includes a transmit band of 1850 MHz to 1915 MHz of Band 25, and the fourth pass band includes a transmit band of 1710 MHz to 1780 MHz of Band 66.

14. A multiplexer comprising: a switch including a common terminal, a first selection terminal, a second selection terminal, and a third selection terminal, the switch being configured to selectively connect the common terminal to the first selection terminal, to the second selection terminal, to the third selection terminal, or simultaneously to at least two of the first selection terminal, the second selection terminal, and the third selection terminal; a first filter connected to the first selection terminal, the first filter having a first pass band; a second filter connected to the second selection terminal, the second filter having a second pass band that is different from the first pass band; a first inductor connected between the third selection terminal and ground; and a second inductor connected between the first filter and the ground, wherein the first inductor and the second inductor are magnetically coupled to one another.

15. The multiplexer according to claim 14, wherein the first filter is a ladder filter including a series arm resonator placed in a signal path and a parallel arm resonator placed in a ground path connecting a node in the signal path and ground, and the second inductor is provided in the signal path or in the ground path.

16. The multiplexer according to claim 15, wherein the second inductor is placed in the ground path and connected between the parallel arm resonator and the ground.

17. The multiplexer according to claim 14, wherein the first inductor and the second inductor are each a chip inductor.

18. The multiplexer according to claim 17, wherein the switch, the first filter, the second filter, the first inductor and the second inductor are mounted on a same substrate.

* * * * *